United States Patent
Adam et al.

(10) Patent No.: US 8,964,898 B2
(45) Date of Patent: Feb. 24, 2015

(54) MULTI-FUNCTION RECEIVER WITH SWITCHED CHANNELIZER HAVING HIGH DYNAMIC RANGE ACTIVE MICROWAVE FILTERS USING CARBON NANOTUBE ELECTRONICS

(75) Inventors: John D. Adam, Millersville, MD (US); Nicholas G. Paraskevopoulos, Woodbine, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 13/619,088

(22) Filed: Sep. 14, 2012

(65) Prior Publication Data
US 2014/0079167 A1    Mar. 20, 2014

(51) Int. Cl.
| H03K 9/00 | (2006.01) |
| H04L 27/00 | (2006.01) |
| H03G 3/30 | (2006.01) |
| H04W 72/04 | (2009.01) |
| H03H 17/02 | (2006.01) |

(52) U.S. Cl.
CPC ............. *H03G 3/3078* (2013.01); *H04W 72/04* (2013.01); *H03H 17/0266* (2013.01)
USPC ............................. 375/316; 375/349; 370/535

(58) Field of Classification Search
USPC .................................. 370/535; 375/316, 349
See application file for complete search history.

(56) References Cited

U.S. PATENT DOCUMENTS

| 4,669,091 | A | * | 5/1987 | Nossen | 375/232 |
|---|---|---|---|---|---|
| 5,691,987 | A | * | 11/1997 | Friederichs | 370/488 |
| 5,963,113 | A | * | 10/1999 | Ou et al. | 333/193 |
| 5,999,574 | A | * | 12/1999 | Sun et al. | 375/326 |
| 6,125,155 | A | * | 9/2000 | Lesthievent et al. | 375/350 |
| 6,647,022 | B1 | * | 11/2003 | Mailaender | 370/441 |
| 6,823,181 | B1 | * | 11/2004 | Kohno et al. | 455/324 |
| 7,260,372 | B2 | * | 8/2007 | Forster et al. | 455/232.1 |
| 7,411,539 | B2 | * | 8/2008 | Valand | 342/13 |
| 7,605,757 | B1 | * | 10/2009 | Gribble et al. | 342/385 |
| 8,036,315 | B2 | * | 10/2011 | Rabbath et al. | 375/316 |
| RE43,964 | E | * | 2/2013 | Fischer et al. | 379/56.2 |
| 2002/0123306 | A1 | * | 9/2002 | Masoian | 455/7 |
| 2003/0156060 | A1 | * | 8/2003 | Revankar et al. | 342/372 |
| 2003/0210111 | A1 | * | 11/2003 | Shin | 333/193 |
| 2005/0122190 | A1 | * | 6/2005 | Chu | 333/202 |
| 2007/0046396 | A1 | * | 3/2007 | Huang | 333/186 |
| 2007/0190954 | A1 | * | 8/2007 | Murakami et al. | 455/132 |
| 2008/0248770 | A1 | * | 10/2008 | Schultz et al. | 455/188.1 |

(Continued)

OTHER PUBLICATIONS

Colinet et al, Array of coupled resonators e.g. nano electromechanical system type resonator for use in e.g. bandpass filter . . . , 2010.*

(Continued)

*Primary Examiner* — Jean B Corrielus
(74) *Attorney, Agent, or Firm* — Rothwell, Figg, Ernst & Manbeck, P.C.

(57) ABSTRACT

Multi-function receivers are disclosed in which high dynamic range active microwave filters using nanoscale devices are disposed within a switched channelizer stage. In an embodiment the receiver includes an input low noise amplifier, a switched channelizer comprised of active filters utilizing nanoscale devices, an output amplifier, a mixer, and an analog to digital converter. Additionally, the use of highly selective active filters in the channelizer allows for the optional elimination of the mixing stage, improving cost and overall volume.

7 Claims, 4 Drawing Sheets

(56) References Cited

U.S. PATENT DOCUMENTS

| | | | |
|---|---|---|---|
| 2010/0102986 A1* | 4/2010 | Benischek et al. | 340/855.8 |
| 2011/0024305 A1* | 2/2011 | Ervin | 205/775 |
| 2012/0001689 A1* | 1/2012 | Ludwig | 330/252 |
| 2012/0140780 A1* | 6/2012 | Chang | 370/479 |
| 2012/0188029 A1* | 7/2012 | Chen et al. | 333/212 |
| 2012/0189084 A1* | 7/2012 | Yu | 375/340 |
| 2012/0201330 A1* | 8/2012 | McHenry | 375/297 |
| 2013/0163648 A1* | 6/2013 | Kennard | 375/219 |

OTHER PUBLICATIONS

L. Darcel, et al., "New MMIC Approach for Low Noise High Order Active Fitters", Microwave Symposium Digest, IEEE MTT-S International, 2005, pp. 787-790.

J. Baumgardner, et al., "Inherent Linearity in Carbon Nanotube Field-effect Transistors", Applied Physics Letters, vol. 91(5), 2007, pp. 052107-1-052107-3.

R. Malmqvist, et al., "Estimation of Spurious-free Dynamic Range for Recursive Active Microwave Integrated Filters", Asia Pacific Microwave Conference, vol. 2, 1999, pp. 238-241.

J. Lee, et al., "A Novel Bandpass Filter Using Active Capacitance", Microwave Symposium Digest, IEEE MTT-S International, vol. 3, 2003, pp. 1747-1750.

H. Diab, et al., "Microwave Active Filter Using Finite Gain Amplifier", Microwave Conference, 32nd European Digital Object Identifier, 2002, pp. 1-4.

I. Hunter, et al., "Intermodulation Distortion in Active Microwave Filters", IEE Proc-Microw. Antennas Propag., vol. 145, No. 1, Feb. 1998, pp. 7-12.

R. Malmqvist, et al., "Analysis of Intermodulation and Noise Performance for Recursive Active Microwave Integrated Filters", IEEE Xplore, 29th European Microwave Conference, Munich, 1999, pp. 60-63.

Kim, et al., "Analysis of a Novel Active Capacitance Circuit Using BJT and Its Application of RF Bandpass Fitters", Department of Electronic Engineering, Sogang University, IEEE, 2005, pp. 2207-2210.

Krantz, et al., "Active Microwave Filters with Noise Performance Considerations", IEEE Transactions on Microwave Theory and Techniques, vol. 42, No. 7, Jul. 1994, pp. 1368-1379.

* cited by examiner

US 8,964,898 B2

MULTI-FUNCTION RECEIVER WITH SWITCHED CHANNELIZER HAVING HIGH DYNAMIC RANGE ACTIVE MICROWAVE FILTERS USING CARBON NANOTUBE ELECTRONICS

BACKGROUND OF THE INVENTION

1. Field of the Invention

The present invention relates to high frequency electronics. More specifically, the present invention relates to the use of nanoscale devices in active microwave filters and their application to switched channelizers for high frequency multi-function receivers.

2. Description of the Related Art

Although radar and communications receivers are susceptible to both accidental and intentional interference, the effects of this interference may be minimized through the use of radio frequency (RF) filters in the initial stages of the receiver chain. These filters reduce the power of the interfering signals to acceptable levels, which improves sensitivity and enables operation with acceptable signal to noise ratios.

Present systems use miniature thin-film bulk acoustic wave resonator passive filters, which are commonly referred to as "TFR filters" or "FBAR filters." TFR filters are small, high-Q, and may be used in radar or communications modules. However, they have limited bandwidth (less than 8%) and use discrete components that make integration excessively difficult and expensive. Monolithic inclusion of these passive filters into a Si or GaAs MMIC process would require the addition of piezoelectric thin film materials into the fabrication as well as additional steps. Although current passive filter technologies have suitable dynamic range for microwave applications, they suffer from substantial bandwidth and loss limitations due to the fact that they are not easily MMIC compatible. They must be fabricated on a separate chip and then separately integrated into a transmit/receive module. Therefore, the use of passive filters in a radar or communications receiver can significantly increase not only a receiver's size, but also its cost.

Active filters, wherein the gain from active devices within the filter compensates for losses in passive components, are ideal for use in radar and communications systems. Although they have been studied for many years, active filters have not been used in high performance receivers because their dynamic range is always less than that of the active components. This can be attributed to the non-linear behavior of present active devices. Thus, current active RF filters using either III-V or SiGe transistor technologies have inadequate dynamic range for next-generation radar and communications applications.

Due to their limitations, suitable RF filters are not widely used in current radar and communications systems. However, next-generation multi-function RF systems will include a wideband RF stage, followed closely by a mixer and analog-to-digital converter (ADC) and it is essential that any interfering signals are excluded from the mixer and ADC if operation in a dense interference environment is contemplated. Thus, there remains a need for high dynamic range filters that may be integrated into a MMIC design without substantial added cost or volume.

SUMMARY OF THE INVENTION

According to an embodiment of the present invention, a radar or communications receiver is provided that includes an input low noise amplifier, a switched channelizer comprised of active filters utilizing nanoscale devices, an output amplifier, a mixer, and an analog to digital converter. The inclusion of filters having five or more poles allows for the elimination of the mixer and the analog to digital converter operates with a sampling frequency that is tuned such that the selected channel is within its Nyquist zone.

Some advantages of the present invention over the prior art include a substantial increase in the spurious free dynamic range of microwave active filters, enablement of the use of switched channelizer MMICs for digital and communications receivers, and a reduction in the number of discrete components required for a receiver stage. The reduction in the number of components reduces the overall cost, noise, and loss while resulting in a smaller total size which enables integration into radar transmit/receive modules as well as portable communications equipment. The present invention allows for the incorporation of filters, with characteristics sufficient to exclude interfering RF signals from propagating to subsequent stages, into MMIC designs without substantial added cost or volume. Radar or communications receivers according to the present invention can have a third order intercept more than 30 dBm greater than prior art receivers.

Other objects and advantages will be apparent to those of skill in the art upon review of the detailed description of the preferred embodiments and the accompanying drawings, in which like components are designated with like reference numerals.

DETAILED DESCRIPTION OF THE PREFERRED EMBODIMENTS

Figure 1:
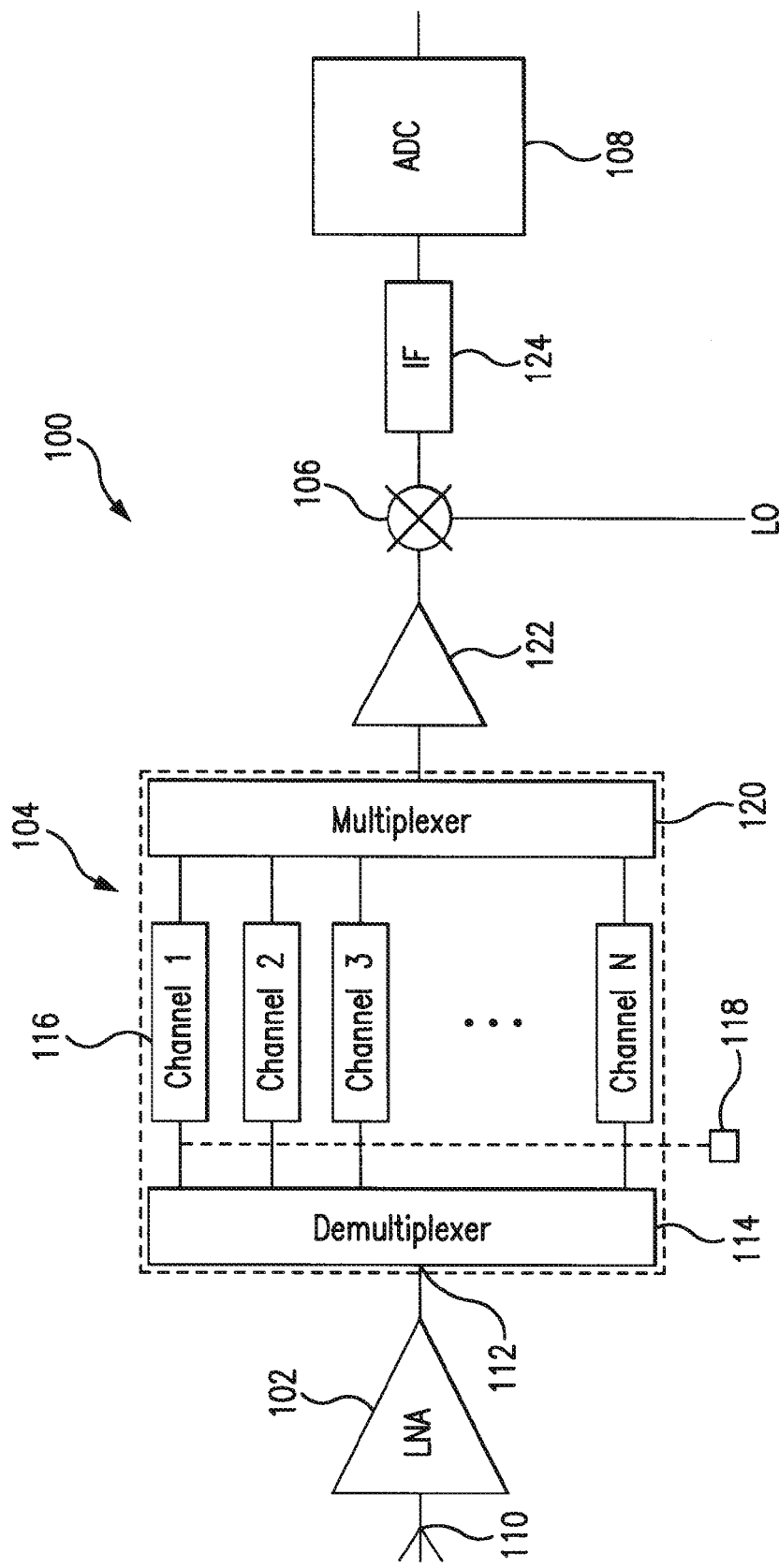
FIG. 1 is a block diagram of a receiver chip with microwave active filters containing nanoscale devices used as switched channelizers according to an embodiment of the present invention.
Figure 2B:
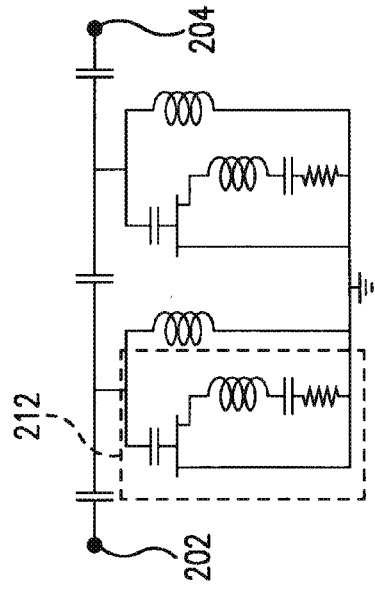
FIGS. 2(a)-(d) are schematics of exemplary microwave active filter circuit configurations according to the present invention.
Figure 2D:
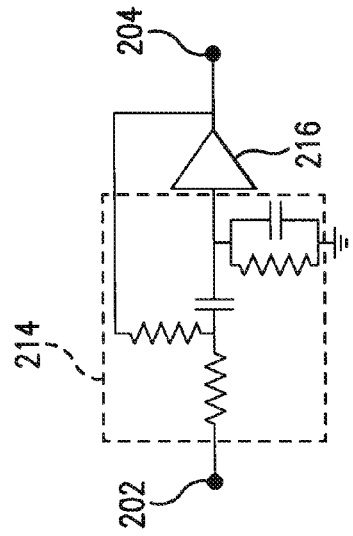
Figure 2A:
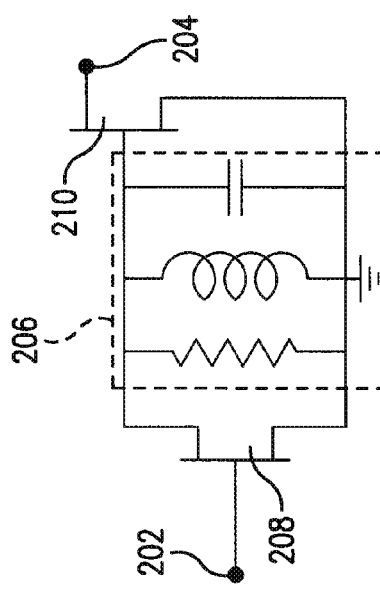
Figure 2C:
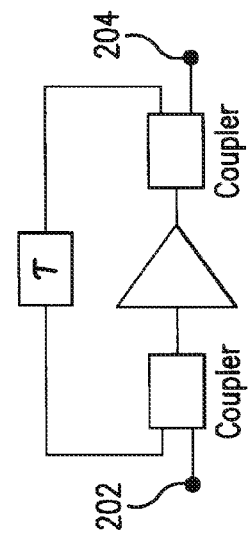

FIG. 1 shows a block diagram of a receiver circuit 100 according to an embodiment of the present invention. The receiver includes a low noise amplifier (LNA) 102, a switched channelizer 104 comprised of nanoscale devices, a mixer 106, and an analog to digital converter (ADC) 108. Also shown in this embodiment are an optional second LNA 122 for additional amplification of signals from the switched channelizer 104 and an intermediate frequency (IF) filter 124. The LNAs 102 and 122 and filters 104 and 124 are preferably comprised of nanoscale devices. Examples of suitable nanoscale devices include, but are not limited to, nanowires, quantum dots, molecular transistors and carbon nanotube field-effect transistors (CNT FETs). The LNAs and filters can be fabricated on a common CNT MMIC chip resulting in small size and low cost.

The channelizer consists of input demultiplexer 114 and output multiplexer 120 with a plurality of transmission channels 116, each containing at least one bandpass filter, coupled between them. The channelizer further includes an electrical terminal 118 for selection of the appropriate channel. The demultiplexer 114 directs the amplified wideband signal into channels or signal paths 116 having specified narrowband operable frequencies. In radar operation, a frequency channel is selected so that its filter may reject interference from undesired emitters. The channelizer 104 is optimally located at the front end of a receive module, such that frequency selection occurs prior to any amplification of a combined signal from multiple elements.

The demultiplexer 114 and multiplexer 120 may simply be common node connections with appropriate matching circuits provided the dimensions of the active filters and connecting lines are significantly less than λ/4. Alternatively, a passive microstrip multicoupler may be used if required by the filter size. The filter channel 116 is selected by applying the appropriate bias voltage to the desired filters through the terminal 118. Channels containing unbiased filters are essential "off".

In operation, a wideband signal is received at antenna 110 and passes through the LNA 102 to the input 112 of the switched channelizer 104. The LNA 102 is important because the noise figure of an active filter is approximately 3 dB, and may not be significantly reduced through the use of CNT FETs. The first LNA 102 is constructed using a first CNT FET stage having a small number of nanotubes, and thus high output impedance, to provide a high-gain. This first stage feeds the CNT active filters in the channelizer 104, which have a larger number of nanotubes, and thus a lower output impedance, which in turn feeds the second LNA 122, having more nanotubes, an even lower impedance, and the capability of driving a 50Ω load. This method is disclosed by Pesetski et al. in U.S. application Ser. No. 12/896,349, "High Impedance Microwave Electronics," the contents of which are incorporated herein by reference. In the present embodiment, this method may be applied to the demultiplexer 114 and multiplexer 120, mixers 106, and active filters such that they may operate at a high impedance (reduced power dissipation) with a similar impedance transformation at the output.

After passing through the selected channels 116, the narrowband signals are combined in the second multiplexer 120 and applied to a mixer 106 for conversion to an intermediate frequency (IF) after passing through output amplifier 122. The IF signal passes through an intermediate filter 124, which may also be a CNT FET active device, onto the ADC 108. Active filters with two or three poles provide sufficient rejection (greater than 20 dBm) of interfering signals within the configuration provided in FIG. 1. However, the use of filters having five or more poles provides for highly selective channelizers that enable a reduction in the number of necessary components.

FIG. 2 shows example microwave active filter circuit configurations using nanoscale devices and located within signal channels 116. Input and output terminals 202 and 204 interface with demultiplexer and multiplexer 114 and 120 (FIG. 1), respectively, accommodating signal propagation through the channelizer. FIG. 2A shows the layout for an actively coupled resonator filter. The filter in FIG. 2A uses a G-L-C resonant cell 206 coupled between two transistors 208, 210. The design methodology for this 3-pole filter was reported by Darcel et al. and is published at "New MMIC Approach for Low Noise High Order Active Filters," 2005 IEEE MTT-S International Microwave Symposium Digest, pp 787-90, 2005. FIG. 2B shows an active filter utilizing active capacitance. In this configuration, a FET is configured 212 to behave as an active capacitor—exhibiting both negative resistance and well as capacitance. This configuration is published by Lee et al., "A Novel Bandpass Filter Using Active Capacitance," 2003 IEEE MTT-S International Microwave Symposium Digest, pp 1747-50, 2003. FIG. 2C illustrates a 2-pole recursive feedback active filters as reported by Malmqvist et al, published at "Estimation of Spurious-Free Dynamic for Recursive Active Microwave Integrated Filters," 1999 Asia Pacific Microwave Conference, Volume 2, pp 238-41, 1999. FIG. 2D shows the layout for Sallen-Key type active filter. These filters use only RC elements 214 in conjunction with a voltage amplifier 216, therefore minimizing circuit volume. This technique is discussed by Diab et al., at "Microwave Active Filter Using Finite Gain Amplifier," 2002 European Microwave Conference. In accordance with the present invention, each of the active elements found in the filters shown in FIG. 2A-D is a CNT FET.

The third-order-intercept (TOI) of an active filter, such as those shown in FIG. 2A-D, is directly proportional to the TOI of the active devices used in the filter circuit (for example transistor 208). Carbon nanotube FETs have a TOI that is 100 to 1000 times greater, at the same dissipated power level, than the devices currently being used in active filters. This result was reported by Northrop Grumman Corporation and is published at "Inherent Linearity in Carbon Nanotube Field-Effect Transistors", J. Baumgardner, A. Pesetski, J. Murdock, J. Przybysz, J. Adam, and H. Zhang, Applied Physics Letters, 91, 052107 (2007), the contents of which are incorporated herein by reference. Thus, the use of highly linear CNT FETs in active filter design produces filters with 100 to 1000 times greater higher TOI, enabling their use in next-generation radar and communications receiver applications. For instance, an active filter utilizing CNT FETs will have a TOI of approximately 30 dBm greater than present designs at a given power level. This TOI is comparable to the TOI objective of a typical receiver chain as a whole.

Figure 3:
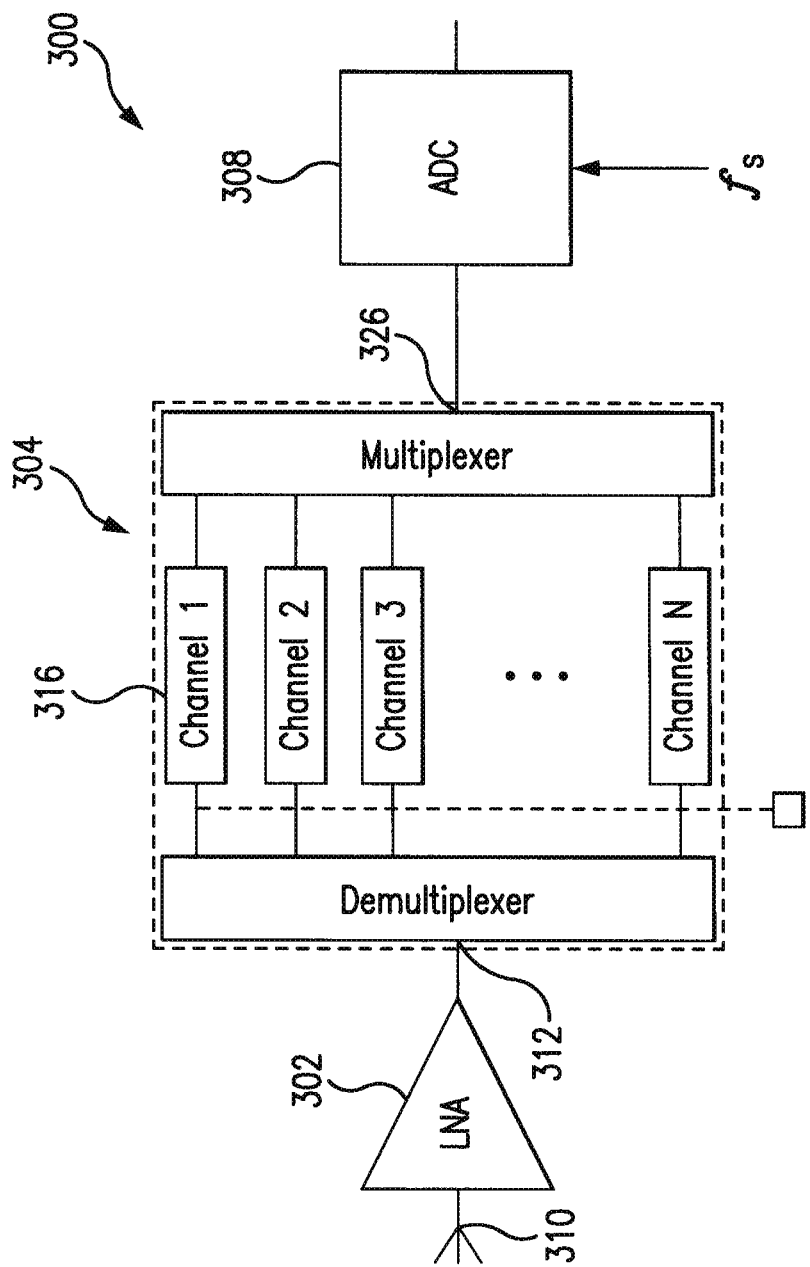
FIG. 3 is a block diagram of a simplified receiver chip using highly selective multi-pole active filters containing nanoscale devices used as narrowband switched channelizers according to an embodiment of the present invention.

FIG. 3 shows a preferred embodiment 300 of the present invention using highly selective 5-pole-minimum microwave active filters within the channelizer channel paths 316. In this embodiment, the broadband signal received at channelizer input 312 from LNA 302 and antennae 310, passes through the selected channels 316 incorporating active filters having between 5 to 8, or more, poles. A narrow band signal then passes directly from the channelizer output 326 to the ADC 308, without the need for a mixer or intermediate frequency synthesis. The mixer is a major contributor to the overall TOI of a standard receiver module, and the elimination of the mixer and associated elements enhances overall performance. The ADC 308 operates at a sampling frequency, $f_s$, which is tuned such that the specified frequency of the selected channel 316 falls within a Nyquist zone of the ADC 308. This is accomplished by tuning the ADC 308 sampling frequency, $f_s$ to be at least twice the specified frequency of the selected channel 116.

Figure 4:
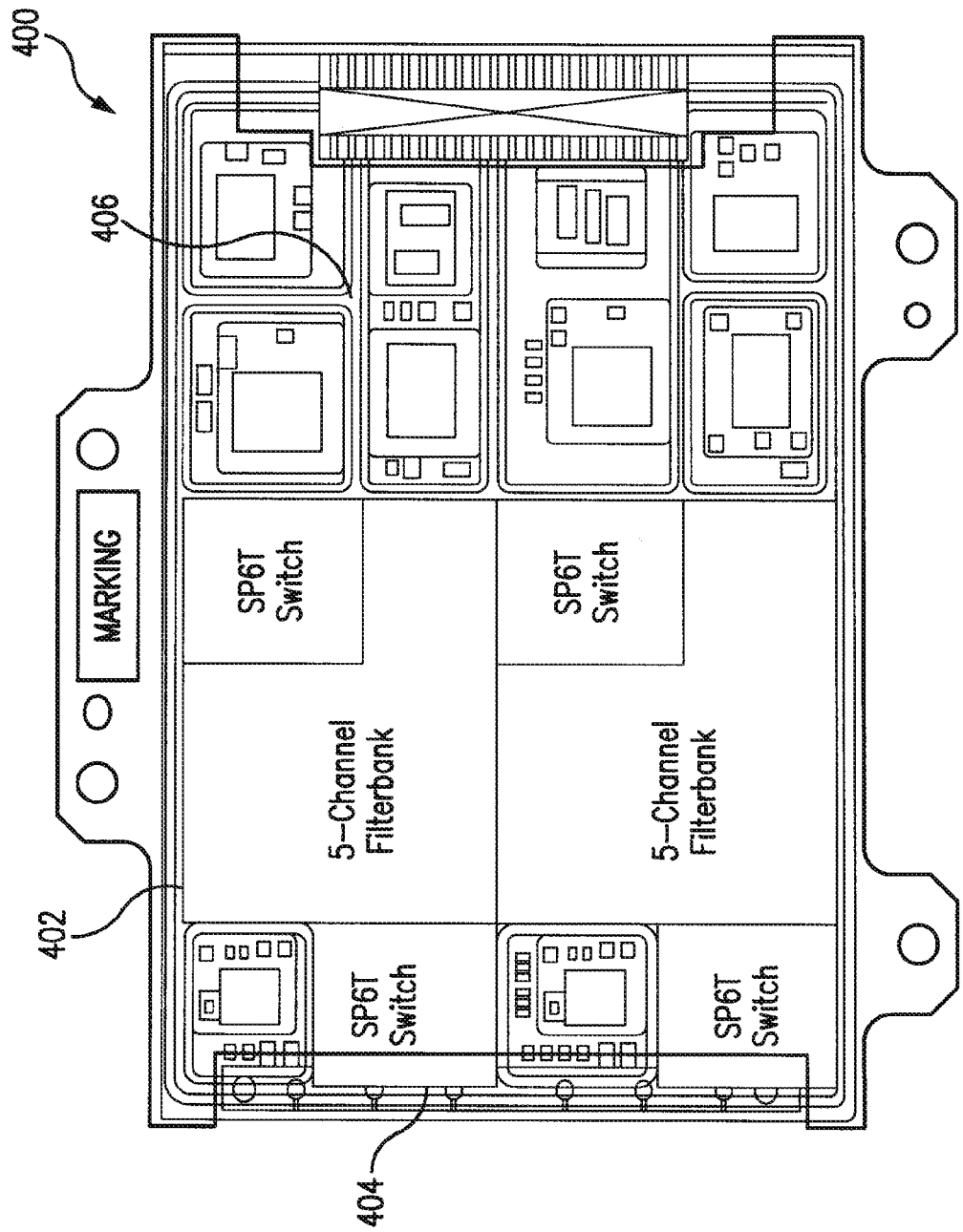
FIG. 4 is a receiver module containing nanoscale devices according to an embodiment of the present invention.

FIG. 4 shows a state-of-the-art dual channel receiver module 400. Each receiver includes a five-channel channelizer 402 (which include a direct through path) using TFR filters and two GaAs switch chips 404. The other elements 406 include highly integrated heterojunction bipolar junction transistor-based conversion modules. The present embodiment 300 supplants the switched TFR channelizer elements 402, 404 with CNT FET based active filters chips. All of the CNT FET devices, as well as the required passive elements are fabricated in a standard MMIC resulting in a chip with small size and low cost.

From the above, it will be appreciated that the use of nanoscale devices in the switched channelizer of a radar or communications receiver provides substantial benefits over the present use of low dynamic range active filters or bulky passive filters which are incompatible with standard MMIC processing.

Thus, a number of preferred embodiments have been fully described above with reference to the figures. Although the invention has been described based upon these preferred embodiments, it would be clear to those of skill in the art that certain modifications, variations, and alternative constructions would be apparent, while remaining within the spirit and scope of the invention.

The invention claimed is:

1. A receiver comprising:
a first amplifiers configured to receive an electronic signal from an antenna;
a switched channelizer configured to receive an electronic signal from at least said first amplifiers, said channelizer comprising:
a demultiplexer configured to receive said electronic signal and transmit said electronic signal to a plurality of signal channels;
at least one active microwave bandpass filter comprising a first nanoscale device located within at least one of said signal channels;
a multiplexer configured to receive an electronic signal from at least one of said channels and generate an output signal; and
a selection terminal configured to receive a control signal, wherein said control signal activates at least one of said signal channels,
wherein said first nanoscale device is at least one of a carbon nanotube field effect transistor, nanowire transistor, quantum dot device, and molecular transistor;
a second amplifier connected to an output of said multiplexer that includes at least one carbon nanotube field effect transistor configured to amplify said output signal from said channelizer;
a mixer connected to an output of said second amplifier; and
an intermediate frequency filter connected to said mixer that includes at least one nanoscale device configured to receive a signal from said mixer.

2. The receiver of claim 1, wherein said receiver is configured to select at least one of said plurality of signal channels based on an applied bias to a filter of said channelizer.

3. The receiver of claim 1, wherein said receiver is a monolithic microwave integrated circuit.

4. The receiver of claim 1, wherein said active filter has a third order intercept of at least 30 dBm.

5. The receiver of claim 1, wherein said active microwave filter is chosen from at least one of actively coupled resonator filters, active capacitance filters, recursive filters, and Sallen-Key filters.

6. The receiver of claim 1, wherein said first amplifier includes at least one carbon nanotube field effect transistor.

7. The receiver of claim 1 further comprising an analog to digital converter connected to said intermediate frequency filter.

* * * * *